(12) United States Patent
Bae

(10) Patent No.: US 7,223,686 B2
(45) Date of Patent: May 29, 2007

(54) SEMICONDUCTOR INTERCONNECTION LINE AND METHOD OF FORMING THE SAME

(75) Inventor: Se-Yeul Bae, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 217 days.

(21) Appl. No.: 11/026,717

(22) Filed: Dec. 30, 2004

(65) Prior Publication Data

US 2005/0140020 A1    Jun. 30, 2005

(30) Foreign Application Priority Data

Dec. 31, 2003   (KR) ...................... 10-2003-0101806

(51) Int. Cl.
*H01L 21/4763* (2006.01)
(52) U.S. Cl. ...................................... 438/622; 438/118
(58) Field of Classification Search ................ 438/118, 438/622, 623, 624
See application file for complete search history.

(56) References Cited

U.S. PATENT DOCUMENTS

| | | | |
|---|---|---|---|
| 6,084,304 A * | 7/2000 | Huang et al. | ............... 257/762 |
| 6,559,548 B1 * | 5/2003 | Matsunaga et al. | ......... 257/774 |
| 6,747,355 B2 * | 6/2004 | Abiru et al. | ............... 257/758 |

* cited by examiner

*Primary Examiner*—Roy Potter
(74) *Attorney, Agent, or Firm*—Andrew D. Fortney

(57) ABSTRACT

An interconnection line of a semiconductor device and a method of forming the same using a dual damascene process are disclosed. An example interconnection line of a semiconductor device includes a semiconductor substrate, a first interconnection line formed on the substrate, an insulating layer pattern formed on the substrate to expose a portion of the first interconnection line, and a metal pad layer formed on the exposed portion of the first interconnection line. The example interconnection line also includes an intermediate insulating layer formed on the entire surface of the substrate and having a via hole and a trench exposing the metal pad layer, and a second interconnection formed in the via hole and the trench and electrically connected to the first interconnection line through the metal pad layer.

9 Claims, 7 Drawing Sheets

SEMICONDUCTOR INTERCONNECTION LINE AND METHOD OF FORMING THE SAME

TECHNICAL FIELD

The present disclosure relates to a semiconductor device, and more particularly, to an interconnection line of a semiconductor device and a method of forming the same using a dual damascene process.

BACKGROUND

Aluminum (Al) has mainly been used as an interconnection line material for a semiconductor device in the past. However, copper (Cu) has been recently used as an interconnection line material instead of Al, because the integration density and the speed of semiconductor devices have increased, so the line width of the interconnection lines has been reduced, thereby decreasing their resistance and contact resistance and reducing occurrence of electro migration (EM), is disclosed in U.S. Pat. No. 6,198,170.

As Cu has low resistivity and high resistance against EM compared with Al, it can provide high reliability when used an interconnection line for a high integration density device and a high-speed device. On the other hand, as it is impossible to pattern Cu by dry etching, to form a Cu interconnection line, a dual damascene process is used to form a via hole and a trench in an intermediate insulating layer, the via hole and the trench are filled with Cu, and a planarization process must be performed.

A known method of forming an interconnection line for a semiconductor device is described with reference to FIG. 1A to FIG. 1G. As shown in FIG. 1A, a semiconductor substrate 10 on which a lower insulating layer 11 and a first interconnection line 12 are formed, is provided. An etch stop layer 13 is then formed on the entire surface of the substrate, and an intermediate insulating layer 14 of an oxide layer is formed on the etch stop layer 13.

As shown in FIG. 1B, a first photoresist pattern (not shown) is formed on the intermediate insulating layer 14 by a photolithography process, and the intermediate insulating layer 14 is then etched by an etching process using the first photoresist pattern as an etching mask, to form a via hole 15 exposing the portion of the etch stop layer 13 over the first interconnection line 12. Thereafter, the first photoresist pattern is removed by a well-known method.

As shown in FIG. 1C, a sacrificial layer 16 is formed on the intermediate insulating layer 14 to fill the via hole 15. The sacrificial layer 16 is then removed to expose the intermediate insulating layer and to form a recess over the sacrificial layer 16 of the via hole 15. The sacrificial layer 16 is formed of a photoresist layer.

As shown in FIG. 1D, a second photoresist pattern 17 is formed on the intermediate insulating layer 14 by a photolithography process, and the portion of the intermediate insulating layer 14 is then etched by an etching process using the second photoresist pattern 17 as an etch mask, to form a trench 18 including the via hole 15 at the upper portion of the via hole 15.

As shown in FIG. 1E, the second photoresist pattern 17 is removed by a well-known method. At this time, the sacrificial layer 16 is also removed, to expose the etch stop layer 13 at the bottom of the via hole 15.

As shown in FIG. 1F, the exposed portion of the etch stop layer 13 is removed, to expose the first interconnection layer 12 at the bottom of the via hole 15.

As shown in FIG. 1G, a Cu layer is formed on the intermediate insulating layer 14 to fill the via hole 15 and the trench 18, and a planarization process is then performed to expose the intermediate insulating layer 14, thereby forming a second interconnection line 19 that is electrically connected to the first interconnection line 12.

In the known method of forming the interconnection line as described above, when forming the via hole 15, the etch stop layer 13 stops the intermediate insulating layer 14 from being etched to prevent damage to the first interconnection line 12 due to the etching. Therefore, a material having high etch selectivity to the intermediate insulating layer 14 such as, for example, a nitride layer must be used as the etch stop layer 13.

However, the nitride layer has problems in that RC delay increases and the speed of a device manufactured thereby is deteriorated because it has a relatively high dielectric constant (high-k) compared with the oxide layer. To overcome these problems, an insulating layer of a low dielectric constant (low-k) has been used as the intermediate insulating layer 14, but it is difficult to obtain good effects if the etch stop layer 13 at the bottom of the via hole 15 is not fully removed.

Here, the etch stop layer 13 remains at the bottom of the via hole 15 because a polymer (not shown) remains over the sacrificial layer 16 when etching the intermediate insulating layer 14 for forming the trench 18, and this prevents the sacrificial layer 16 from being removed when removing the second photoresist pattern 17 for the sacrificial layer 16 to remain in the via hole 15, so that the etch stop layer 13 is not fully removed when removing the etch stop layer 13.

Accordingly, to prevent the etch stop layer 13 from remaining at the bottom of the via hole 15, the sacrificial layer 16 remaining in the via hole 15 must be fully removed by additionally performing a washing or a post etch treatment (PET), but there is problem in that this causes process time and fabrication cost to increase.

DETAILED DESCRIPTION

In general, the example methods and apparatus described herein provide an interconnection line of a semiconductor device that is capable of preventing a lower interconnection line from being damaged when etching an intermediate insulating layer for forming a via hole and a trench, and reducing RC delay.

In general, the example interconnection line disclosed herein includes: a semiconductor substrate; a first interconnection line formed on the substrate; an insulating layer pattern formed on the substrate to expose the portion of the first interconnection line; a metal pad layer formed on the exposed portion of the first interconnection line; an intermediate insulating layer formed on the entire surface of the substrate and having a via hole and a trench exposing the metal pad layer; and a second interconnection formed in the via hole and the trench and electrically connected to the first interconnection line through the metal pad layer.

An example method of forming the interconnection line for a semiconductor device described herein includes: providing a semiconductor substrate on which a first interconnection line is formed; forming an insulating layer pattern exposing a portion of the first interconnection line on the substrate; forming a metal pad layer on the exposed portion of the first interconnection line; forming an intermediate insulating layer on the entire surface of the substrate; etching the intermediate insulating layer to form a via hole exposing the metal pad layer; etching a portion of the intermediate insulating layer to form a trench at the upper portion of the via hole; and forming a second interconnection line electrically connected to the first interconnection line through the metal pad layer in the via hole and the trench.

Furthermore, the insulating layer pattern and the intermediate insulating layer are respectively formed of one selected from a silicon oxide (SiO2) layer, an FSG (Fluoro-Silicate Glass) layer, and an insulating layer of a low dielectric constant (low-k) of below 3.0. Additionally, the metal pad layer is formed of one selected from a W layer, a Ti layer, a TiN layer, a Ta layer and a TaN layer.

Figure 1A:
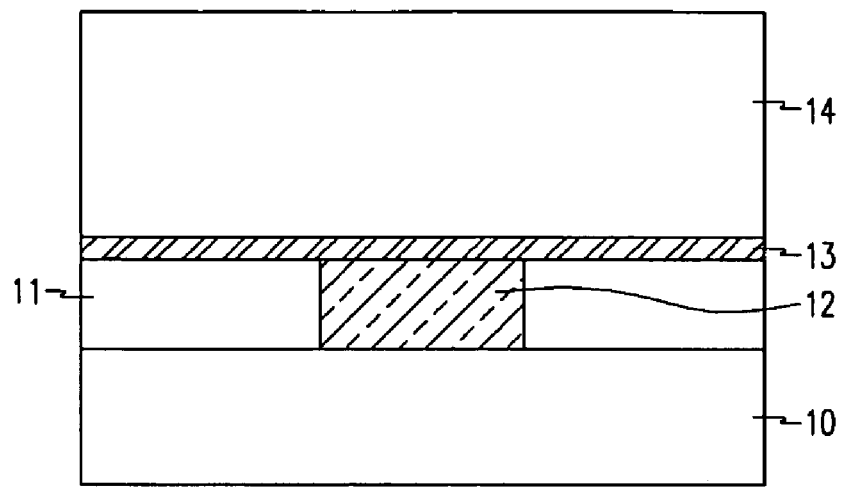
FIGS. 1A to 1G are cross-sectional views depicting a known method of forming an interconnection line for a semiconductor device.
Figure 1B:
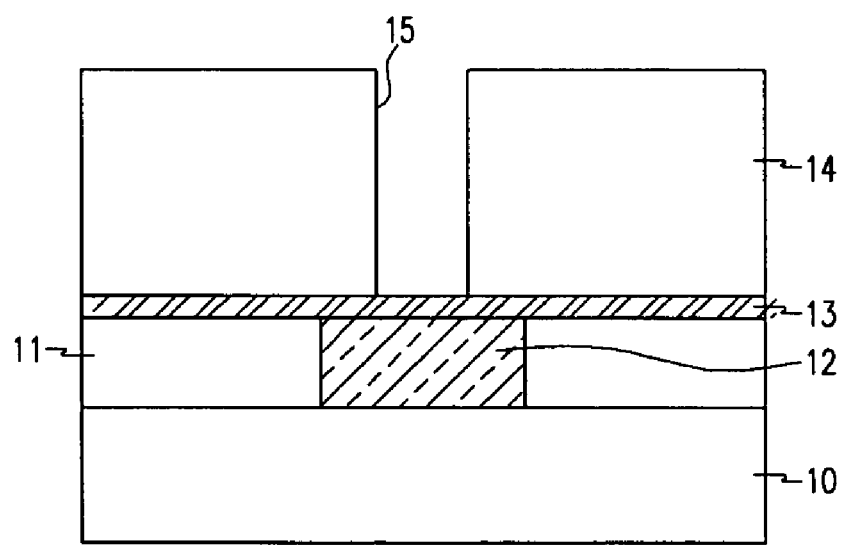
Figure 1C:
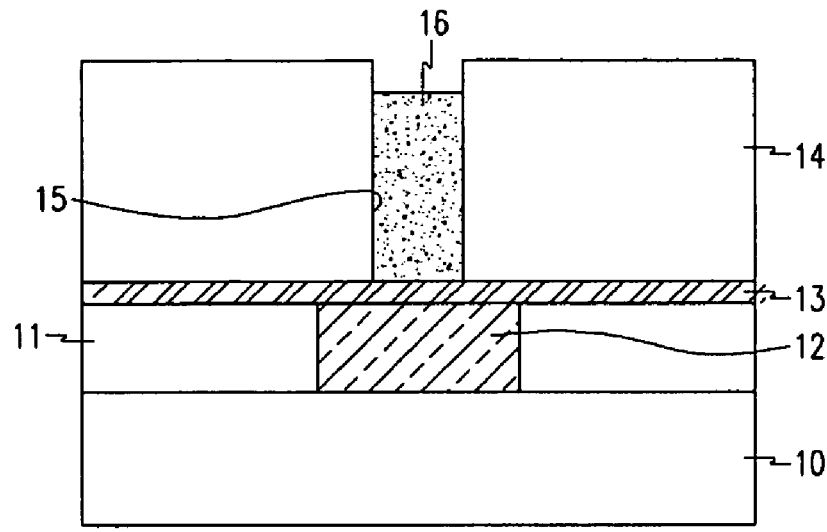
Figure 1D:
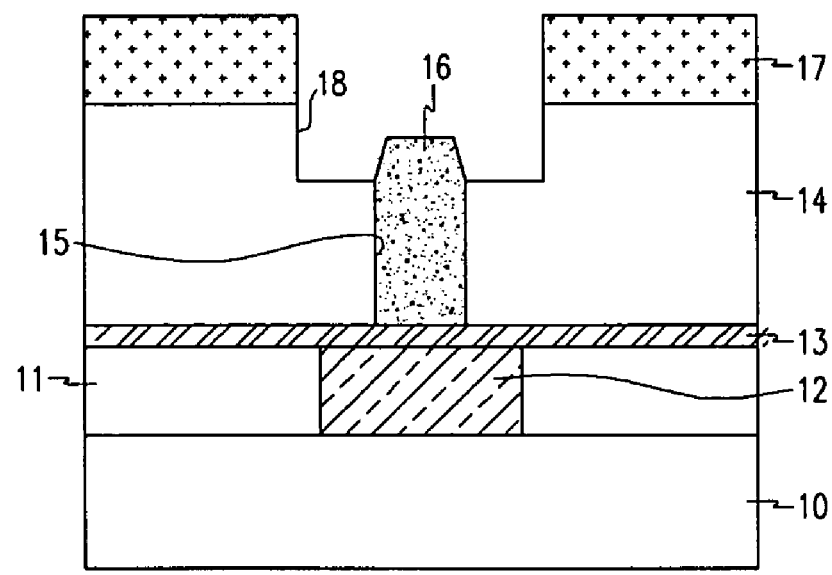
Figure 1E:
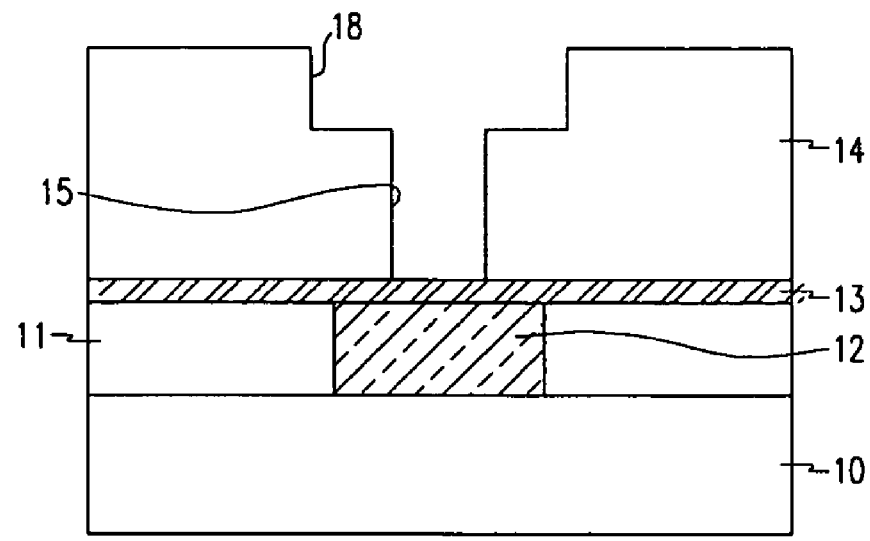
Figure 1F:
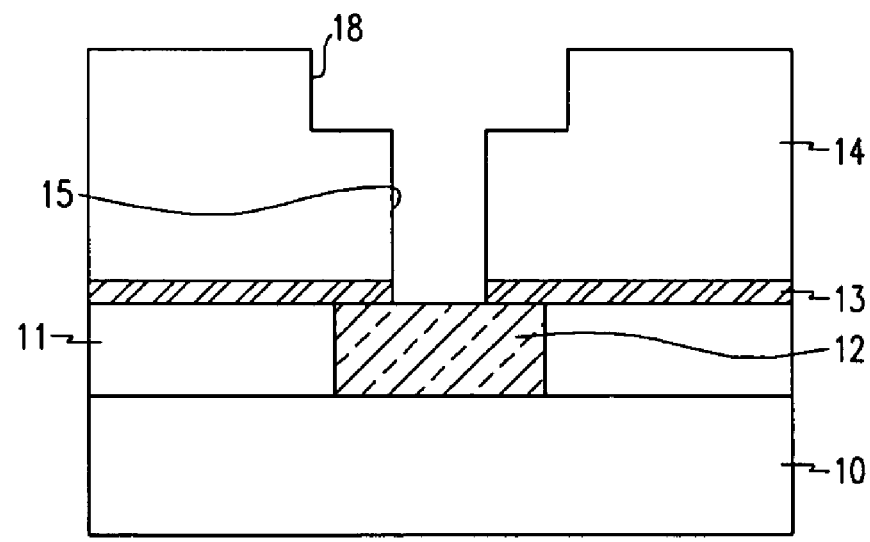
Figure 1G:
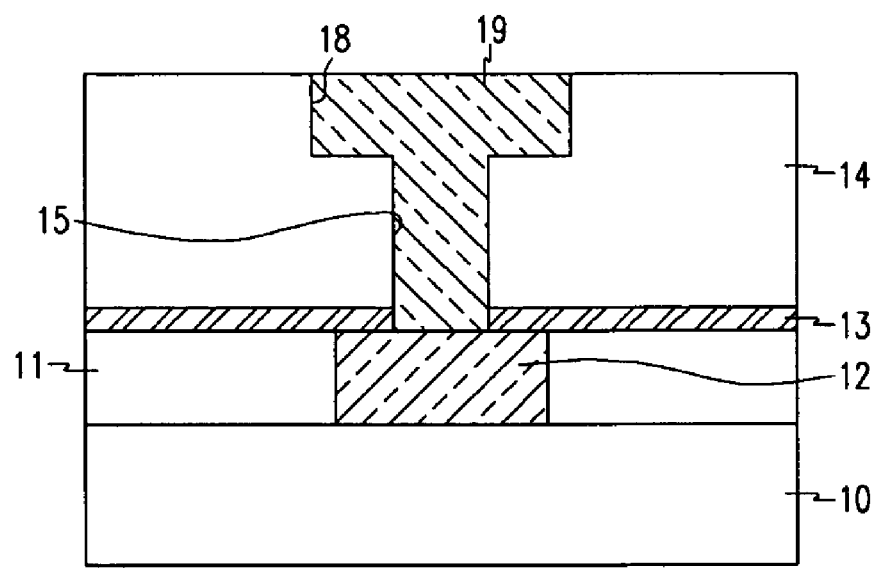
Figure 2A:
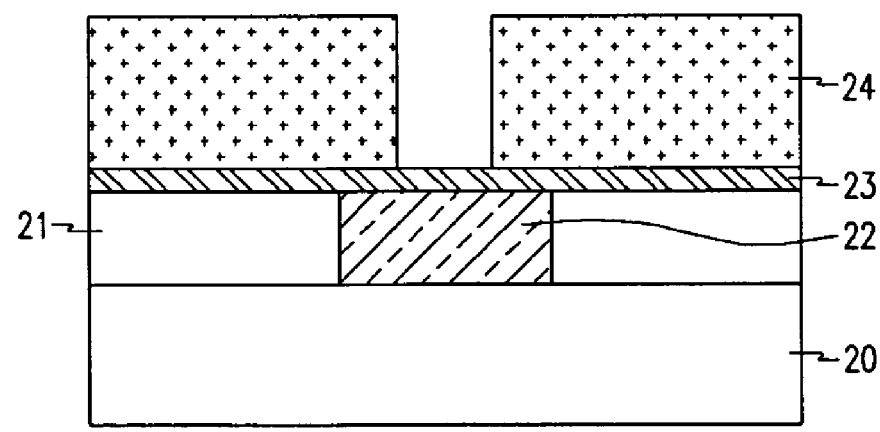
FIGS. 2A to 2F are cross-sectional views depicting an example method of forming an interconnection line for a semiconductor device.

An example method of forming an interconnection line for a semiconductor device is described with reference to FIG. 2A to FIG. 2F. As shown in FIG. 2A, a semiconductor substrate 20 on which a lower insulating layer 21 and a first interconnection line 22 are formed is provided. The first interconnection line 22 is formed of a Cu layer. Then, an insulating layer 23 is relatively thinly formed on the entire surface of the substrate, and a first photoresist pattern 24 exposing the portion of the insulating layer 23 over the first interconnection line 22 is formed on the insulating layer 23 by a photolithography process. The insulating layer 23 is formed of one selected from a silicon oxide (SiO2) layer, an FSG (Fluoro-Silicate Glass) layer, and an insulating layer of a low dielectric constant (low-k) of below 3.0. Furthermore, the first photoresist pattern 24 is thinly formed to provide as accurate an alignment as possible.

Figure 2B:
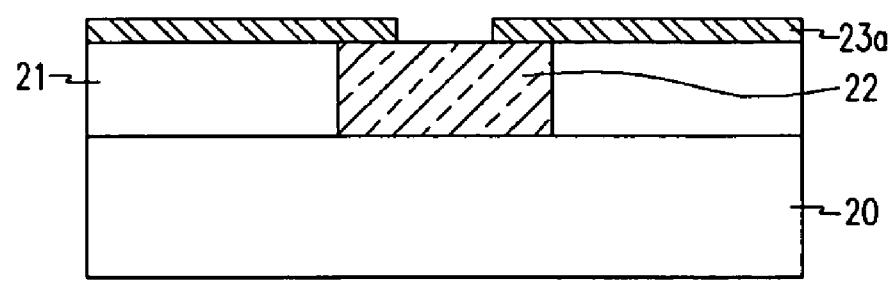

As shown in FIG. 2B, the insulating layer 23 is etched by an etching process using a first photoresist pattern 24 (referring to FIG. 2A) as an etch mask to form an insulating pattern 23a exposing the portion of the first interconnection line 22. Here, it is preferable that the surface area of the first interconnection line 21 exposed by the insulating pattern 23a is as large as possible. Thereafter, the first photoresist pattern 24 is removed by a well-known method.

Figure 2C:
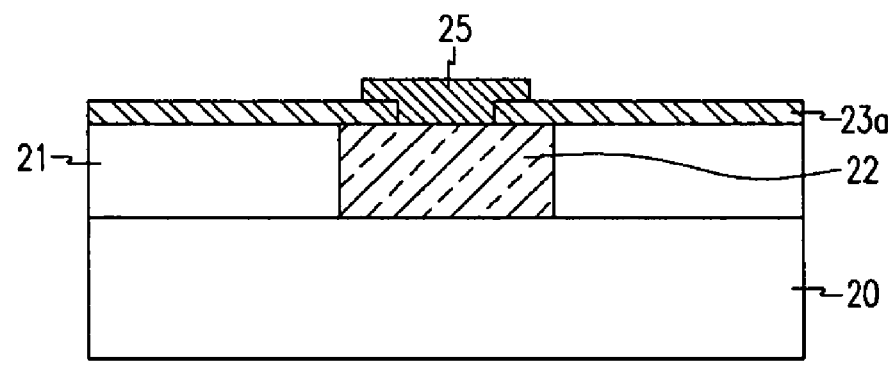

As shown in FIG. 2C, a metal pad layer 25 is selectively formed on the exposed portion of the first interconnection line 22 by a selective deposition method. The metal pad layer 24 is formed of one selected from a W layer, a Ti layer, a TiN layer, a Ta layer and a TaN layer. Furthermore, the metal pad layer 25 is formed to have as large a surface area, within a range in which a short-circuit with adjacent conductive layers (not shown) does not occur, as possible.

Figure 2D:
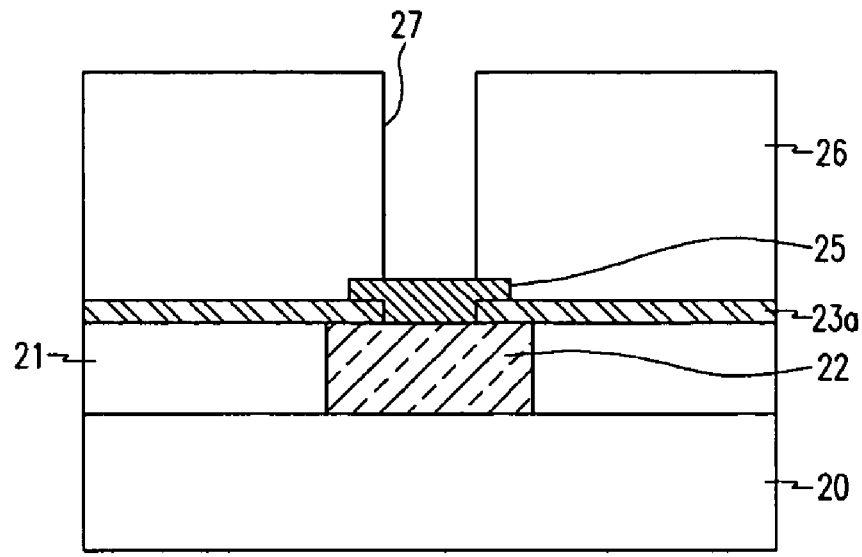

As shown in FIG. 2D, an intermediate insulating layer 26 is formed on the entire surface of the substrate to cover the insulating layer pattern 23a and the metal pad layer 25. The intermediate insulating layer 26 is formed of one selected from a silicon oxide (SiO2) layer, an FSG (Fluoro-Silicate Glass) layer and an insulating layer of a low dielectric constant (low-k) of below 3.0 the same as the insulating layer 23. Thereafter, a second photoresist pattern (not shown) is formed on the intermediate insulating layer 23 by a photolithography process, and the intermediate insulating layer 26 is etched by an etching process using the second photoresist pattern as an etch mask to form a via hole 27 exposing the metal pad layer 25. At this time, the first interconnection line 22 is protected by the metal pad layer 25 so that damage due to the etching does not occur at the first interconnection line 22. The second photoresist pattern is then removed by a well-known method.

Figure 2E:
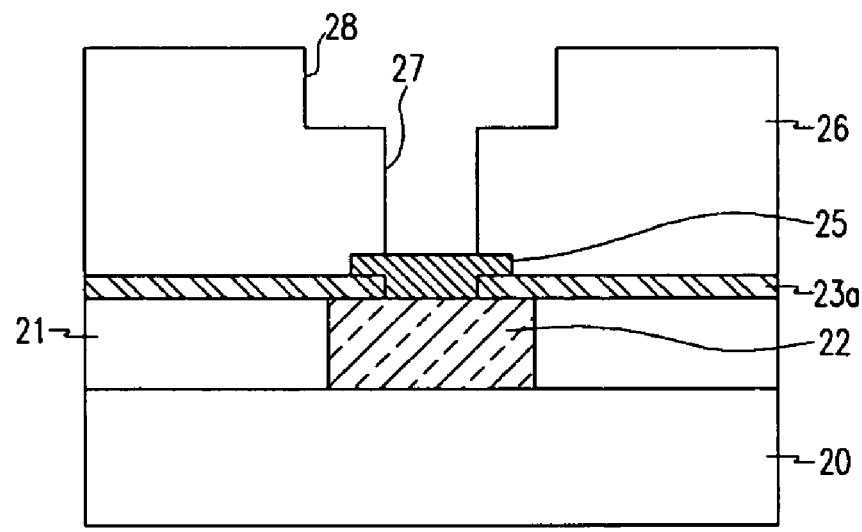

As shown in FIG. 2E, a third photoresist pattern (not shown) is formed on the intermediate insulating layer 26 by a photolithography process, and the portion of the intermediate insulating layer 26 is etched by an etching process using the third photoresist pattern as an etch mask, to form a trench 28 including the via hole 27 at the upper portion of the via hole 27. At this time, the first interconnection line 22 is also protected by the metal pad layer 25 so that damage due to the etching does not occur at the first interconnection line 22. The third photoresist pattern is then removed by a well-known method.

Figure 2F:
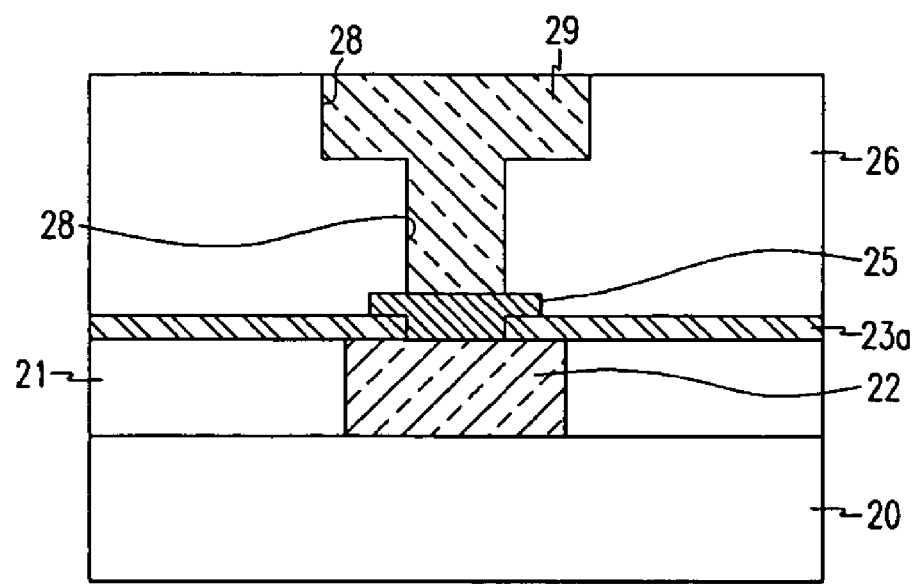

As shown in FIG. 2F, a Cu layer is formed on the intermediate insulating layer 26 by an electroless plating method or an electroplating method so as to fill the via hole 27 and the trench 28. A planarization process is performed by a chemical mechanical polishing (CMP) to expose the intermediate insulating layer 26, thereby forming a second interconnection line 29 that is electrically connected to the first interconnection layer 22 through the metal pad layer 25.

In the example described above, the metal pad layer is selectively formed on the first interconnection line and then the etching process for forming the via hole and the trench are respectively performed.

As a result of the above-described method, damage to the first interconnection line by etching can be prevented. Additionally, problems due to some of the etch stop layer remaining can be overcome, as there is no need to use nitride layer etch stop layer. Still further, the above-described method can reduce RC delay owing to forming the intermediate insulating layer and the insulating layer pattern with the insulating layer of a low dielectric constant (low-k) and can improve the yield and the reliability of a manufactured device.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method of forming an interconnection line for a semiconductor device, comprising:
   providing a semiconductor substrate on which a first interconnection line is formed;
   forming an insulating layer pattern exposing a portion of the first interconnection line on the substrate;
   forming a metal pad layer on the exposed portion of the first interconnection line;
   forming an intermediate insulating layer on the entire surface of the substrate;
   etching the intermediate insulating layer to form a via hole exposing the metal pad layer;
   etching a portion of the intermediate insulating layer to form a trench at an upper portion of the via hole; and
   forming a second interconnection line electrically connected to the first interconnection line through the metal pad layer in the via hole and the trench.

2. The method of claim 1, wherein forming the insulating layer pattern includes:
   forming an insulating layer on the entire surface of the substrate;
   forming a photoresist pattern exposing the portion of the insulating layer over the first interconnection line;
   etching the insulating layer using the photoresist pattern; and
   removing the photoresist pattern.

3. The method of claim 2, wherein the insulating layer is formed of one selected from a silicon oxide ($SiO_2$) layer, an FSG (Fluoro-Silicate Glass) layer, and an insulating layer of a low dielectric constant (low-k) of below 3.0.

4. The method of claim 3, wherein the intermediate insulating layer is formed of one selected from a silicon oxide ($SiO_2$) layer, an FSG (Fluoro-Silicate Glass) layer, and an insulating layer of a low dielectric constant (low-k) of below 3.0.

5. The method of claim 1, wherein the metal pad layer is formed by a selective deposition method.

6. The method of claim 5, wherein the metal pad layer is formed of one selected from a W layer, a Ti layer, a TiN layer, a Ta layer and a TaN layer.

7. The method of claim 1, wherein the first and second interconnection lines are respectively formed of a Cu layer.

8. The method of claim 1, wherein forming the second interconnection line includes:

forming a Cu layer on the intermediate insulating layer so as to fill the via hole and the trench; and performing a planarization process so as to expose the intermediate insulating layer.

9. The method of claim 8, wherein the planarization process is performed by chemical mechanical polishing (CMP).

* * * * *